United States Patent
Lin

(10) Patent No.: US 8,994,084 B2
(45) Date of Patent: Mar. 31, 2015

(54) DYNAMIC RANDOM ACCESS MEMORY AND METHOD FOR FABRICATING THE SAME

(75) Inventor: Chih-Hao Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 137 days.

(21) Appl. No.: 13/221,538

(22) Filed: Aug. 30, 2011

(65) Prior Publication Data

US 2013/0049085 A1   Feb. 28, 2013

(51) Int. Cl.
*H01L 27/108* (2006.01)
(52) U.S. Cl.
CPC .... *H01L 27/10823* (2013.01); *H01L 27/10814* (2013.01); *H01L 27/10876* (2013.01); *H01L 27/10885* (2013.01)
USPC .............................. 257/296; 257/329; 257/331
(58) Field of Classification Search
USPC .......................................... 257/296, 329, 331
See application file for complete search history.

(56) References Cited

U.S. PATENT DOCUMENTS

| | | | | |
|---|---|---|---|---|
| 7,355,230 | B2* | 4/2008 | Thies et al. | 257/296 |
| 8,367,499 | B2* | 2/2013 | Park | 438/268 |
| 2005/0186728 | A1* | 8/2005 | Kim | 438/241 |
| 2007/0082448 | A1* | 4/2007 | Kim et al. | 438/268 |
| 2007/0295995 | A1* | 12/2007 | Yun et al. | 257/202 |
| 2008/0150012 | A1* | 6/2008 | Thies et al. | 257/329 |
| 2009/0148991 | A1* | 6/2009 | Chung et al. | 438/268 |
| 2009/0203178 | A1* | 8/2009 | Kim et al. | 438/287 |
| 2009/0230466 | A1* | 9/2009 | Kim | 257/331 |
| 2010/0090263 | A1 | 4/2010 | Kunkel et al. | |
| 2010/0096693 | A1* | 4/2010 | Hong | 257/331 |
| 2011/0003447 | A1* | 1/2011 | Kim et al. | 438/270 |
| 2011/0254081 | A1* | 10/2011 | Cho et al. | 257/329 |
| 2011/0298046 | A1* | 12/2011 | Hong | 257/331 |
| 2012/0018799 | A1* | 1/2012 | Park | 257/329 |
| 2012/0052668 | A1* | 3/2012 | Lin | 438/589 |
| 2012/0094455 | A1* | 4/2012 | Cho et al. | 438/270 |
| 2012/0104489 | A1* | 5/2012 | Hong | 257/329 |
| 2012/0146136 | A1* | 6/2012 | Park | 257/331 |
| 2012/0146221 | A1* | 6/2012 | Shim | 257/741 |

* cited by examiner

*Primary Examiner* — Zandra Smith
*Assistant Examiner* — Jaehwan Oh
(74) *Attorney, Agent, or Firm* — Muncy, Geissler, Olds & Lowe, P.C.

(57) ABSTRACT

The present invention provides a dynamic random access memory (DRAM) including a plurality of transistors formed in a semiconductor substrate, wherein each of the transistors includes a vertical channel region. A plurality of bit line contained trenches is formed in the semiconductor substrate. Each of the bit line contained trenches comprises two bit lines, and each of the bit lines is electrically connected to an adjacent transistor. Each two sidewalls of each of the bit line contained trenches have a contact formed thereon. A plurality of word lines are formed over the plurality of bit lines and electrical connect to the plurality of transistors. Furthermore, a method for fabricating the DRAM is also provided.

8 Claims, 10 Drawing Sheets

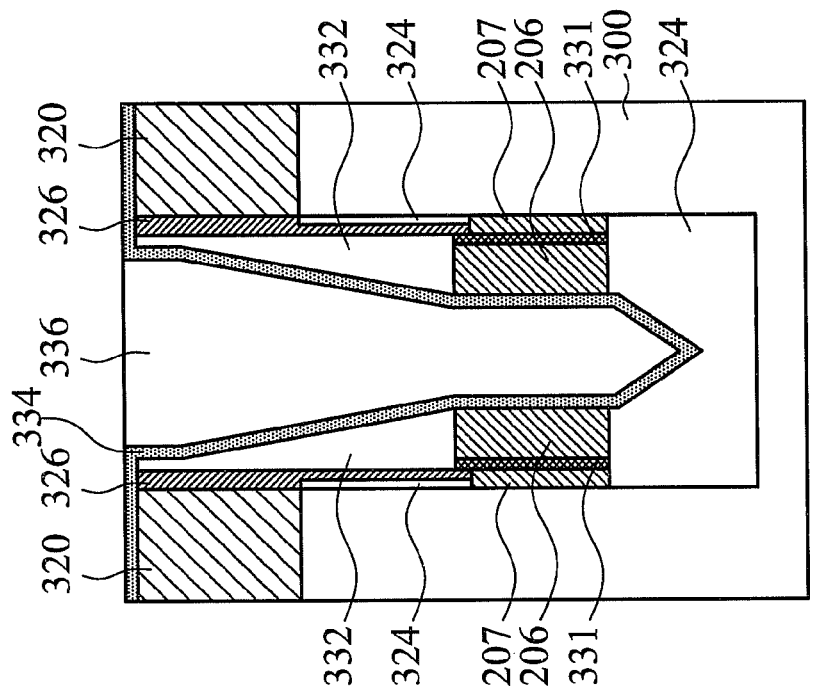
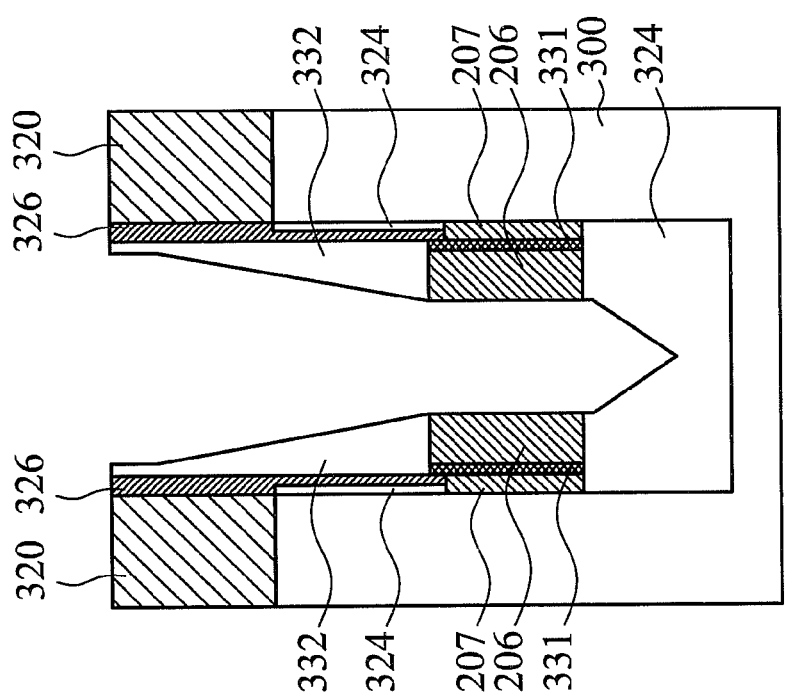

DYNAMIC RANDOM ACCESS MEMORY AND METHOD FOR FABRICATING THE SAME

BACKGROUND OF THE INVENTION

1. Field of the Invention

The present invention relates to a semiconductor device, and in particular, relates to a dynamic random access memory (DRAM) and a method for fabricating the same.

2. Description of the Related Art

In order to reduce unit area of memory cells of a dynamic random access memory (DRAM), a vertical transistor structure has been widely used. In the vertical transistor structure, active regions of transistors are formed in a single crystal semiconductor substrate. Storage capacitors are formed on the top of the active regions. Bit lines and word lines are buried in the semiconductor substrate. Each of the bit lines and each of the word lines are electrically connected to the active regions of the transistors. The variation of electron charges which are stored in the storage capacitors is controlled by the bit lines and the word lines.

At present, many methods for forming a buried bit line have been disclosed. For example, U.S. Pat. No. 7,355,230 discloses a method for forming a buried line. In this method, a channel region of a transistor is formed in a trench surrounded by an insulation liner layer. The trench has an opening formed only on one sidewall and a contact is filled in the opening for electrically connecting the bit line to the channel region of the transistor. However, the process of forming an opening only on one sidewall of the trench is very complicated and results in a poor process window. Thus, to develop a DRAM having the vertical transistor which can address the above issues is needed.

BRIEF SUMMARY OF THE INVENTION

One of the broader forms of an embodiment of the present invention involves a dynamic random access memory, comprising: a plurality of transistors formed in a semiconductor substrate, wherein each of the transistors comprises a vertical channel region; a plurality of bit line contained trenches formed in the semiconductor substrate, wherein each of the bit line contained trenches comprises two bit lines, and each of the bit lines is electrically connected to an adjacent transistor, and wherein each two sidewalls of each of the bit line contained trenches has a contact formed thereon; and a plurality of word lines formed over the plurality of bit lines and electrically connecting to the plurality of transistors.

Another broader form of an embodiment of the present invention involves a method for fabricating a dynamic random access memory, comprising: providing a semiconductor substrate; forming a plurality of bit line trenches in the semiconductor substrate; forming two bit lines in each of the bit line trenches, which comprises the steps of: forming an insulation liner layer in each of the bit line trenches; etching a bottom portion and a side portion of the insulation liner layer such that each two sidewalls of each of the bit line trenches has an exposed portion formed thereon; forming contacts covering the exposed portions; forming a conductive layer in each of the bit line trenches, wherein the conductive layer is in direct contact with the contacts; and etching a center portion of the conductive layer to divide the conductive layer into the two bit lines; forming a plurality of word lines over the plurality of bit lines; and forming a plurality of transistors in the regions between the bit lines and the word lines, wherein each of the plurality of transistors comprises a vertical channel region.

A detailed description is given in the following embodiments with reference to the accompanying drawings.

BRIEF DESCRIPTION OF THE DRAWINGS

The present invention can be further understood by reading the subsequent detailed description and examples with references made to the accompanying drawings, wherein:

FIGS. 3A to 3H illustrate cross-section views of a method of fabricating a bit line of a DRAM at various intermediate stages in accordance with one embodiment of the present invention;

DETAILED DESCRIPTION OF THE INVENTION

Figure 1A:
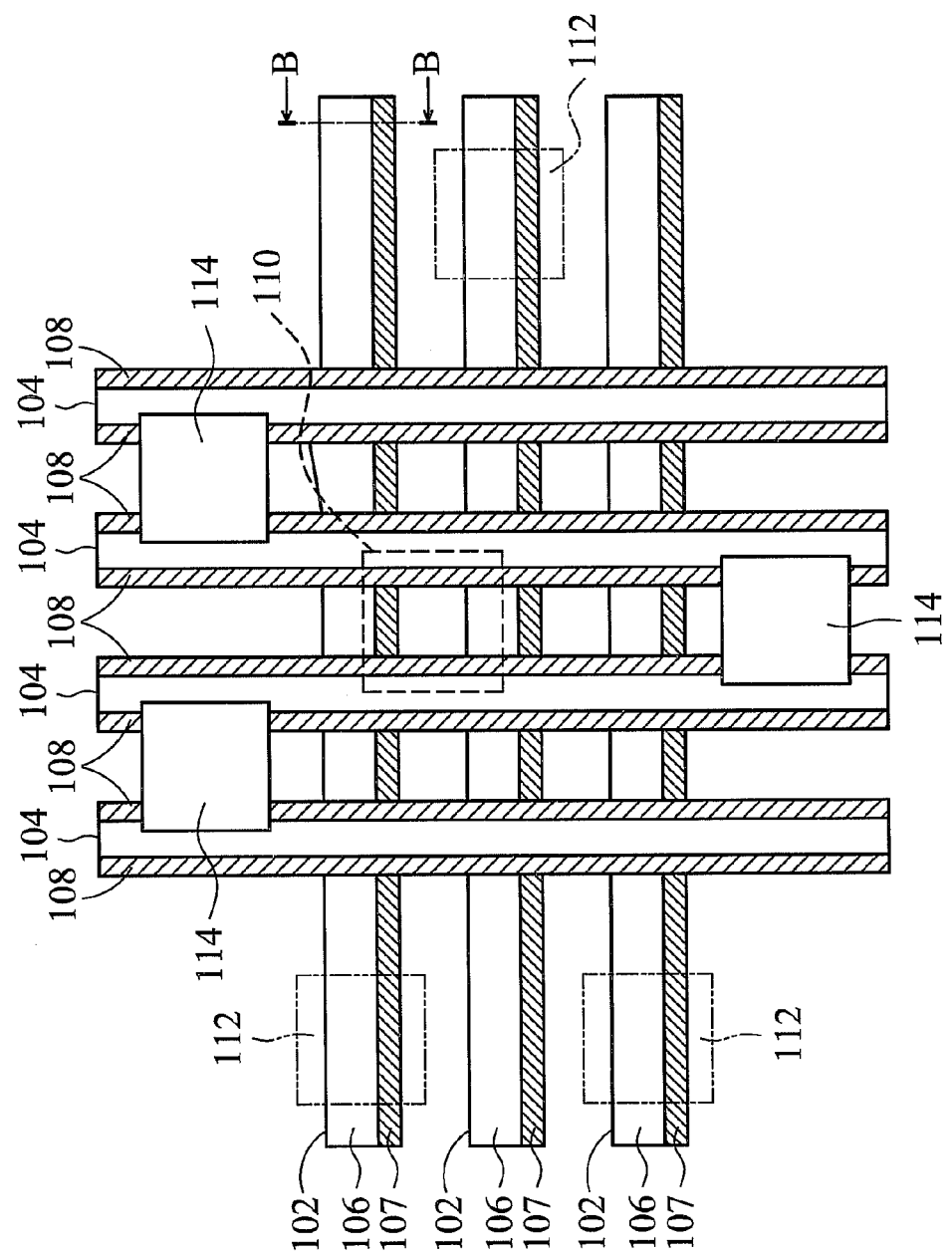
FIGS. 1A and 1B illustrate a top view and a cross-section view of an ordinary DRAM having a vertical transistor, respectively.

The following description is of the best-contemplated mode of carrying out the invention. This description is made for the purpose of illustrating the general principles of the invention and should not be taken in a limiting sense. These are, of course, merely examples and are not intended to be limited. For example, the formation of a first feature over, above, below, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
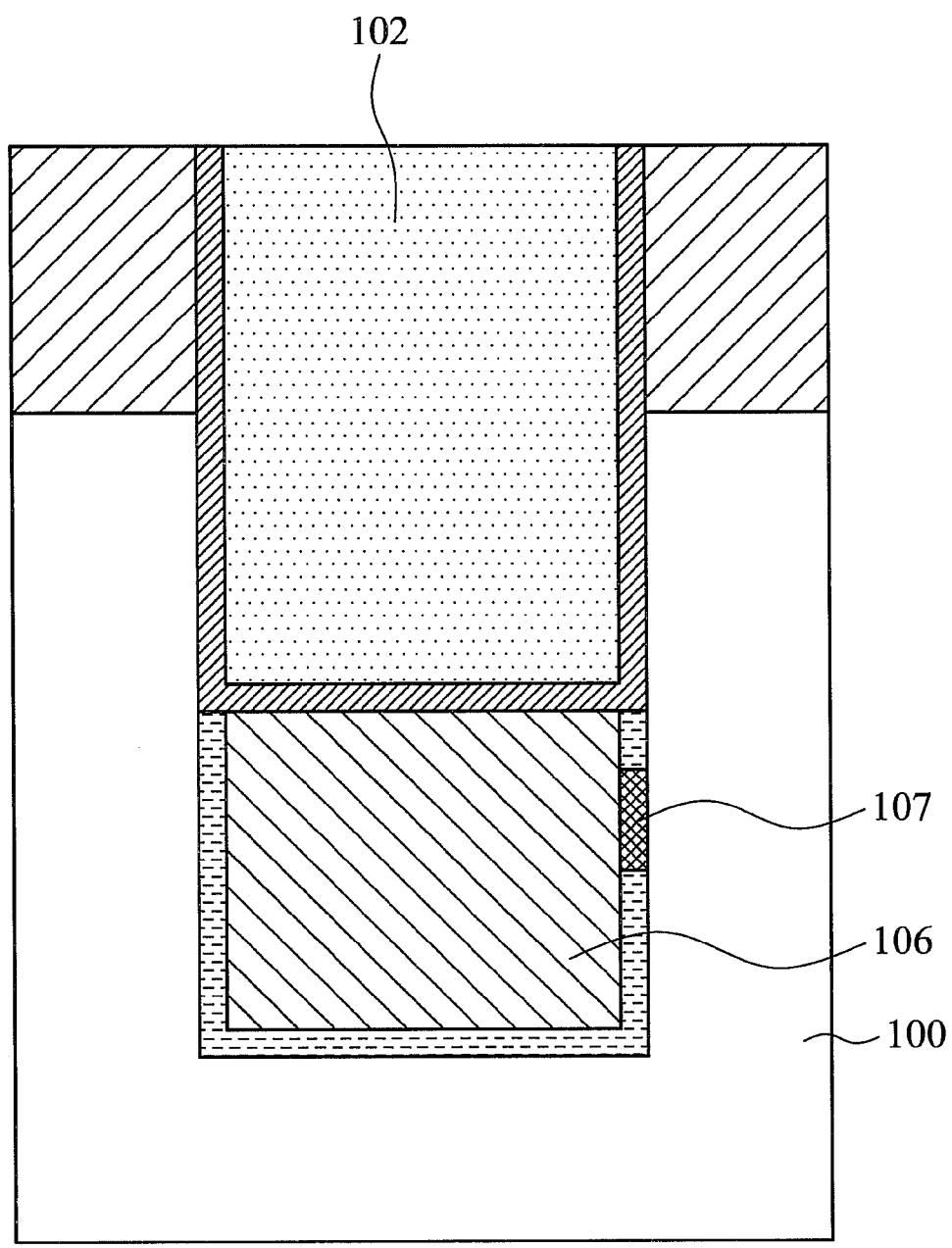

Refer to FIG. 1A and FIG. 1B, illustrating a top view and a cross-section view of an ordinary DRAM having a vertical transistor, respectively. FIG. 1A shows a plurality of bit line contained trenches 102 and a plurality of word line contained trenches 104 which are perpendicular to and cross each other in a semiconductor substrate. Areas 110 between any two adjacent bit line contained trenches 102 and any two adjacent word line contained trenches 104 are active regions of transistors. The active regions of the transistors are non-recessed regions and therefore extend outward from the bulky area of the semiconductor substrate. Each of the bit line contained trenches 102 comprises one bit line 106 therein. Each of the word lines contained trenches 104 comprises two separated word lines 108 therein. Each of the bit lines 106 is electrically connected to the active regions of the transistors via a contact 107 which is formed only on a single side of the bit line 106. Each of the two word lines 108 in one of the word line contained trenches 104 are directly electrically connected to their adjacent active regions of the transistors, respectively. Each of the bit lines 106 has a bit line plug 112 electrically connected thereto for transmitting the input/output signals of the bit lines 106, and the two word lines 108 in one of the word line contained trenches 104 share two word line plugs 114 electrically connected thereto for transmitting the input/output signals of the word lines 108.

Referring to FIG. 1B, FIG. 1B illustrates is a cross-section view along the section B-B shown in the FIG. 1A. In other words, FIG. 1B shows a cross-section view of a structure of a bit line contained trench 102 in the semiconductor substrate 100, in which a bit line 106 is electrically connected to an active region of a transistor via a single sidewall contact 104 which is only formed on one sidewall of the bit line contained trench 102. However, several anisotropic etching steps are needed to perform for fabricating the single sidewall contact 104, and the size and the location of the single sidewall contact 104 is hard to control, which cause a poor process window and a high production cost.

Figure 2:
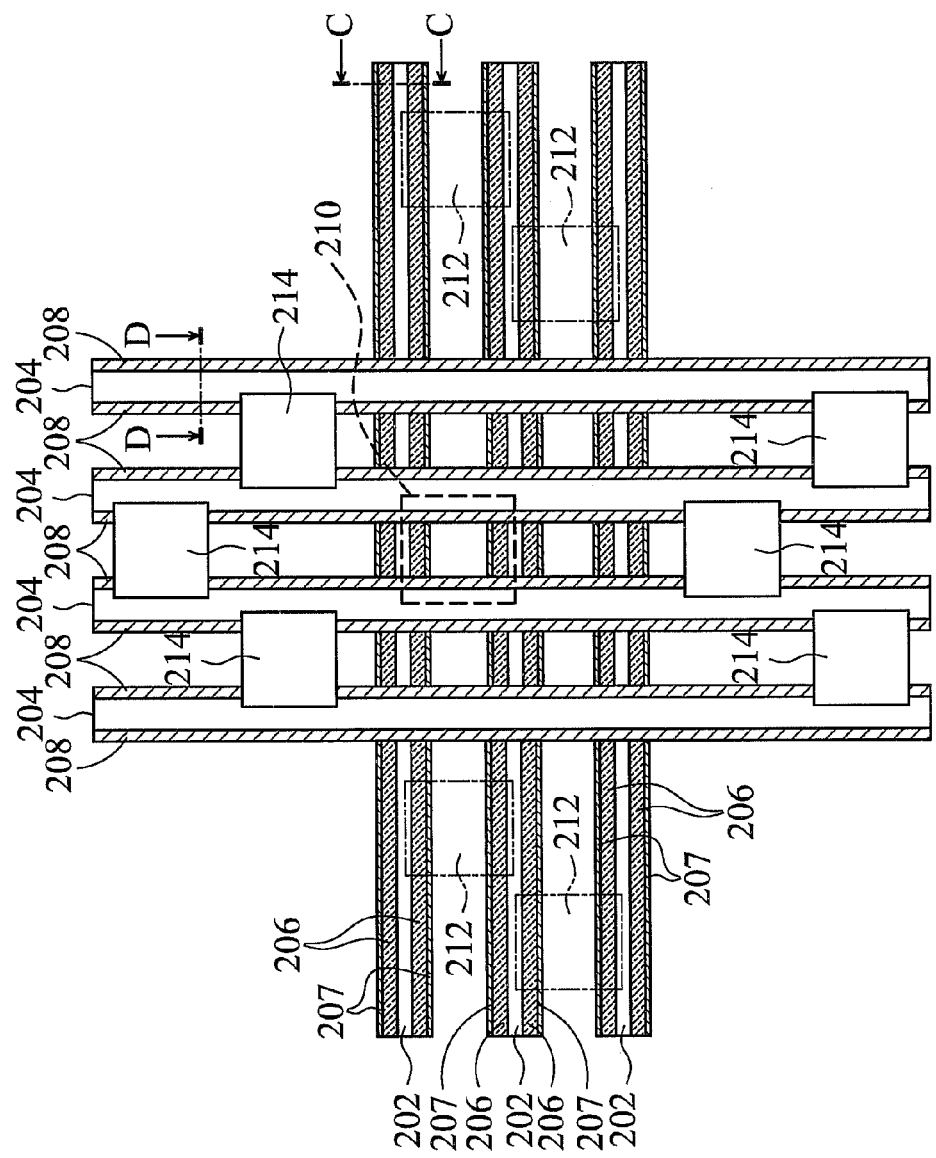
FIG. 2 illustrates a top view of a DRAM in accordance with one embodiment of the present invention.

Here, a DRAM and a method for fabricating the same are provided in accordance with embodiments of the present invention. Referring to FIG. 2, illustrated is a top view of a DRAM according to an embodiment of the present invention. A plurality of bit line contained trenches 202 and a plurality of word line contained trenches 204 are perpendicular to and cross each other in a semiconductor substrate. Areas 210 between any two adjacent bit line contained trenches 202 and any two adjacent word line contained trenches 204 are active regions of transistors. The active regions of the transistors are non-recessed regions and thereby form pillars extending outward from the bulky area of the semiconductor substrate (referring to FIG. 5). Each of the bit line contained trenches 202 has two separated bit lines 206 (i.e., buried bit lines) therein. Each of the word lines contained trenches 204 has two separated word lines 208 (i.e., buried word lines) therein. Each of the two sidewalls of each of the bit line contained trenches 202 has a contact 207 formed thereon for electrically connecting the two separated bit lines 206 to their adjacent active regions of the transistors, respectively. Each of the two separated word lines 208 in each of the word lines contained trenches 204 are directly electrically connected to their adjacent active regions, respectively. Each of the bit lines 206 shares two bit line plugs 212 with another adjacent bit line 206 in another adjacent bit line contained trench 202 for transmitting their input/out signals. Each of the word lines 208 shares two word line plugs 214 with another adjacent word line 208 in another adjacent word line contained trench 204 for transmitting their input/out signals.

In an embodiment, a width of the areas between each of the trenches, such as the bit line contained trenches 202 and the word line contained trenches 204, is dependent upon the minimum feature size F for achieving high density integration. Thus, the DRAM may have $4F^2$ memory cells.

Figure 3B:
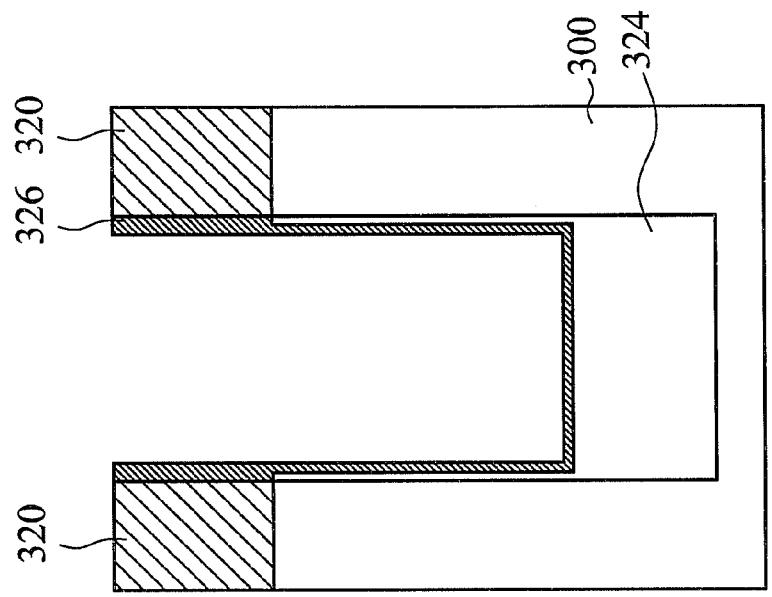
Figure 3A:
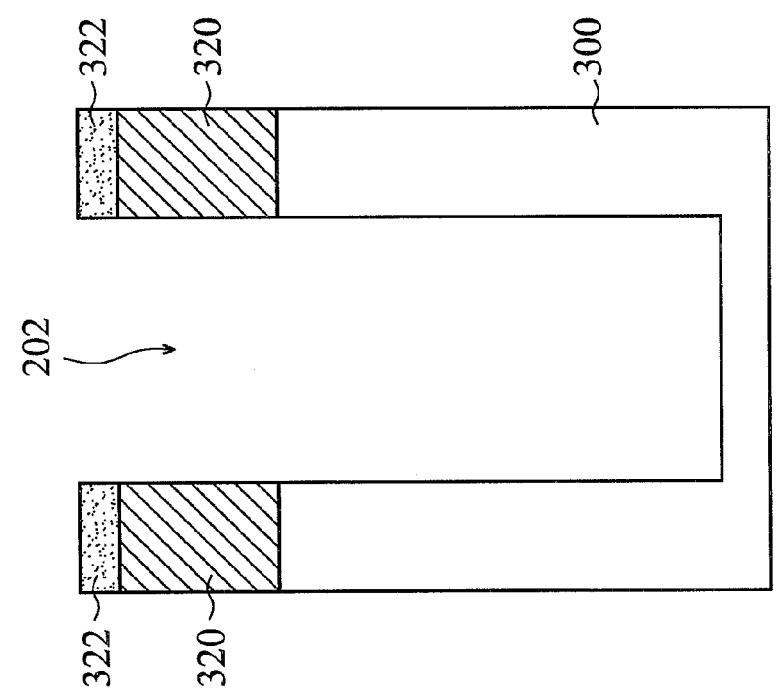

FIGS. 3A to 3H show cross-section views of a method of fabricating a bit line of the DRAM at various intermediate stages according to an embodiment of the present invention. Referring to FIG. 3A, FIG. 3A illustrates a cross-section view along the section C-C shown in FIG. 2. A semiconductor substrate 300 is provided first. In an embodiment, the semiconductor substrate may be an undoped single crystalline silicon substrate or a substrate doped with a conductive type, such as a SiGe substrate doped with p-type dopants. A hard mask 320 is optionally formed on the semiconductor substrate 300. A patterned mask 322 may be formed on the hard mask 320. A trench 202 provided for forming bit lines therein (hereafter referred as to the bit line trench 202) may be formed by etching the semiconductor substrate 300 using the pattern of the mask 322. In an embodiment, the hard mask 320 may comprise silicon nitride, silicon oxide, carbon materials, or combinations thereof. The patterned mask 322 may comprise photoresist, carbon materials, an anti reflective coating (ARC), silicon oxynitride, or combinations thereof. The patterned mask 322 may be removed after the bit line trench 202 is formed.

Referring to FIG. 3B, FIG. 3B illustrates forming an insulation liner layer in the bit line trench 202. In an embodiment, the insulation liner layer may comprise one or more dielectric layers formed of silicon oxide, silicon nitride, silicon oxynitride, low-k dielectric materials, or combinations thereof. In the present embodiment, as shown in FIG. 3B, the insulation liner layer may comprise an insulating layer 324 and a barrier layer 326. In an embodiment, the insulating layer 324 and the barrier layer 326 may be sequentially formed on the bottom and the sidewalls of the bit line trench 202. The barrier layer 326 may cover the insulating layer 324. The insulating layer 324 may be silicon oxide, and the barrier layer 326 may be silicon nitride. The insulating layer 324 and the barrier layer 326 may be formed by various deposition techniques, such as physical vapor deposition (PVD), chemical vapor deposition (CVD), etc. Furthermore, the insulating layer 324 may be formed by a thermal oxide method when it is formed of silicon oxide. In an embodiment, the insulating layer 324 may have a bottom portion thicker than its sidewall portion.

Figure 3D:
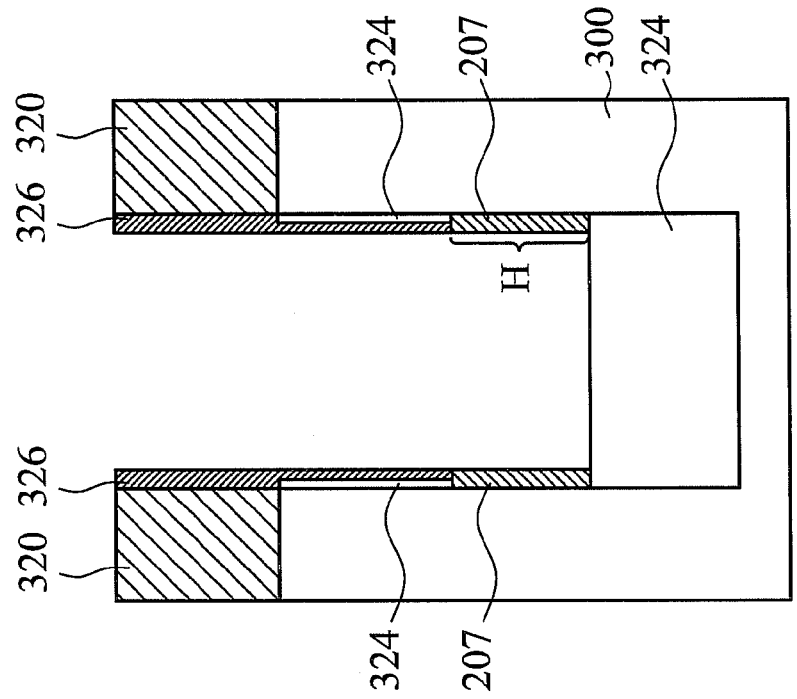
Figure 3C:
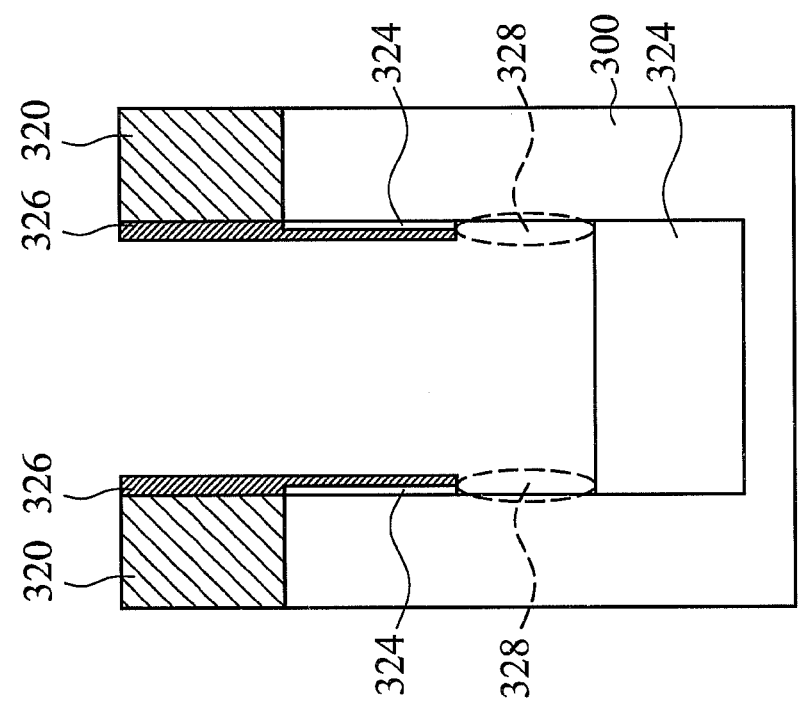

Referring to FIG. 3C, FIG. 3C illustrates etching bottom portions and sidewall portions of the barrier layer 326 and the insulating layer 324 such that each of the two sidewalls of the bit line trench 202 has an exposed portion 328 formed thereon. In an embodiment, the bottom portion and a portion of the sidewall portion of the barrier layer 326 may be removed for exposing the bottom portion and a portion of the sidewall portion of the insulating layer 324. Then, the insulating layer 324 is etched using the remaining portion of the barrier layer 326 as a mask, such that each of the two sidewalls of the bit line trench 202 has an exposed portion 328 formed thereon. Note that although a portion of the bottom portion of the insulating layer 324 is removed, there is still a remaining portion of the insulating layer 324 covering the bottom of the bit line trench 202 for electrically isolating the bit line with the semiconductor substrate in following process.

Referring to FIG. 3D, FIG. 3D illustrates forming of the contacts 207 to cover the exposed portions 328 on the two sidewalls of the bit line trench 202. In an embodiment, an epitaxial polysilicon layer is formed which at least covers the exposed portions 328 on the two sidewalls of the bit line trench 202. Then, a center portion of the polysilicon layer is etched such that the polysilicon layer is divided into two portions to form two separated contacts 207. As such, the exposed portions 328 on the two sidewalls of the bit line trench 202 are covered by the two separated contacts 207, respectively. In an embodiment, the polysilicon layer may be optionally doped, such as doping arsenic, for improving the conductivity of the contacts 207. In some embodiments, the contacts 207 may be diffused into the semiconductor substrate 300 by thermal diffusion for forming a source/drain region of the transistor in the semiconductor substrate 300. In an embodiment, the contacts 207 may have a height H greater than that of the conventional single sidewall contact. For example, the height H may be between about 20 and 500 nm.

Figure 3E:
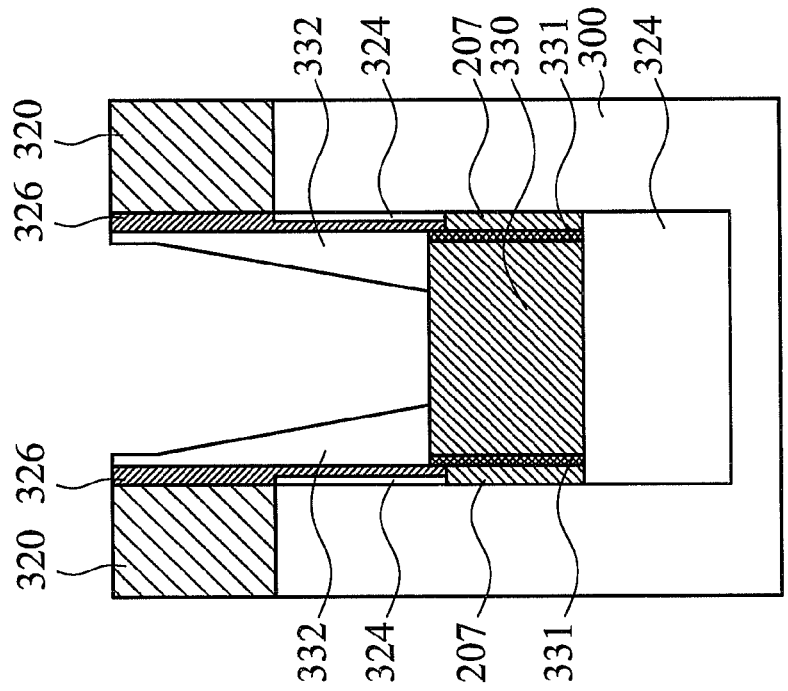

Referring to FIG. 3E, FIG. 3E illustrates forming of a conductive layer 330 in direct contact with the contacts 207 in the trench 202. In an embodiment, the conductive layer 330 may be formed of tungsten or other suitable conductive materials, such as copper. The conductive layer 330 may further comprise a barrier/adhesive layer 331 for preventing diffusion and providing a better adhesion between the conductive layer 330 and the insulating layer 324. The barrier layer 331 may comprise one or more layers formed of Ti, TiN, Ta, TaN, CoNi, NiSi or other similar materials. The barrier layer 331 may have a thickness of between about 50 Å and about 500 Å. In an embodiment, the thickness of the conductive layer 330 can be controlled by using a back etching process. The thickness of the conductive layer 330 may be lower, higher than or equal to the top surface of the contacts 207. Typically, the conductive layer 330 may have a low resistivity and be capable of completely contacting with the contacts 207 when the conductive layer 330 is thicker.

Figure 3F:
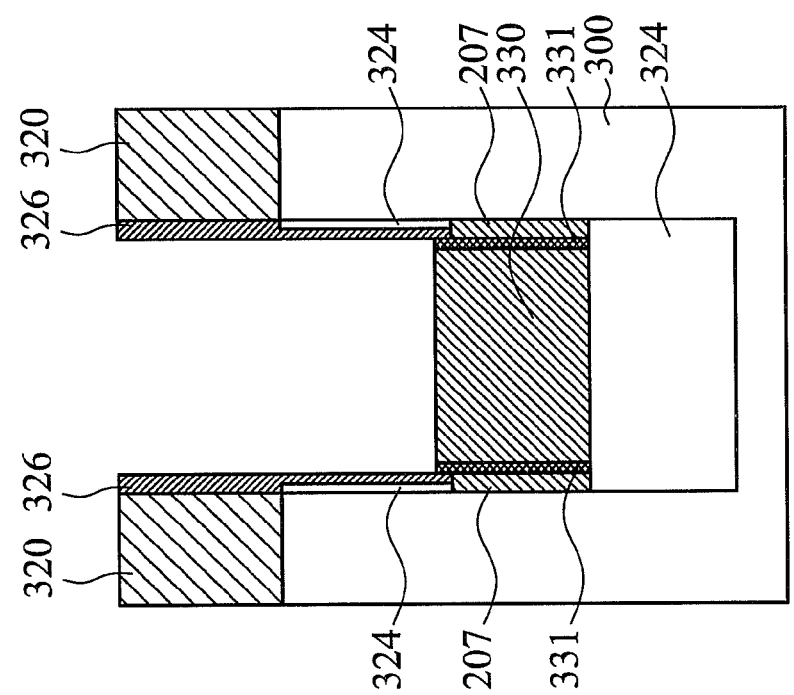

Referring to FIG. 3F, FIG. 3F illustrates forming of a spacer 332 on the conductive layer 330. The spacer 332 may comprise oxide or other low-k materials. In an embodiment, an oxide may be formed on the conductive layer 330 by a thermal oxide method or a deposition process, and then an anisotropic etching process is performed to a center portion of the oxide to form the spacer 332. The spacer 332 may have inclined sidewalls. The spacer 332 may isolate other components in the bit line trench 202 with the active regions of the transistors.

Referring to FIG. 3G, FIG. 3G illustrates forming of bit lines 206 in the bit line trench 202. The conductive layer 330 is etched using the spacer layer 332 as a mask. The etch depth may be at least about 1 μm lower than the bottom of the conductive layer 330. The deeper the etch depth the less leakage will occur. As such, the conductive layer 330 is divided into two portions to form the two bit lines 206 in the bit line trench 202. Each of the two bit lines 206 is electrically connected to its adjacent transistors via one contact 207, respectively.

Then, referring to FIG. 3H, FIG. 3H illustrates forming of a barrier layer 334 and a capping oxide layer 336 in the bit line trench 202 for protecting the two bit lines 206 and isolating the two bit lines 206 to each other. The barrier layer 334 may comprise silicon nitride, silicon oxide, or combinations thereof. In the present embodiment, the barrier layer 334 may be silicon nitride.

Figure 4B:
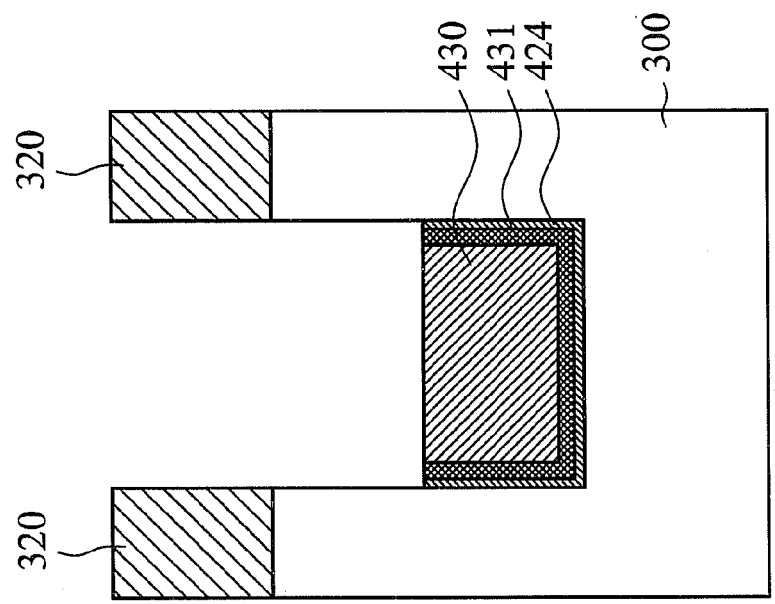
FIGS. 4A to 4D illustrate cross-section views of a method of fabricating a word line of a DRAM at various intermediate stages in accordance with one embodiment of the present invention.
Figure 4A:
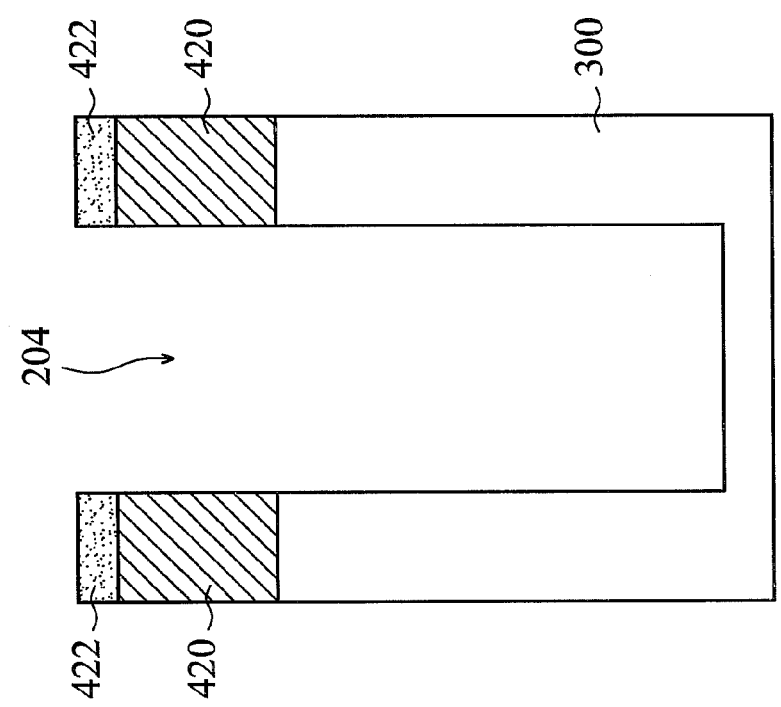

FIGS. 4A to 4D illustrate cross-sectional views of a fabricating method of a word line of the DRAM according to an embodiment of the present invention. In the present embodiment, the words lines may be fabricated by known prior arts, and therefore only a brief description will be presented here. Referring to FIG. 4A, illustrated is a cross-section view along the section D-D shown in FIG. 2. A hard mask 420 and a patterned mask 422 are formed on a semiconductor substrate 300. The pattern of the patterned mask 422 is substantially perpendicular to the pattern of the patterned mask 322 described previously. In an embodiment, the hard mask 420 may comprise silicon nitride, silicon oxide, or combinations thereof. The patterned mask 422 may comprise photoresist, carbon materials, an anti reflective coatings, or combinations thereof. A trench 204 is provided for forming word lines therein (hereafter referred as to the word line trench 204) and formed in the semiconductor substrate 300 using the pattern of the patterned mask 422. The patterned mask 422 may be removed after the word line trench 204 is formed.

Then, referring to FIG. 4B, FIG. 4B illustrates forming of an insulating layer 424 and a conductive layer 430 in the word line trench 204. The sidewalls of the conductive layer 430 may be in direct contact with the sidewalls of the word line trench 204. In an embodiment, the insulating layer 424 may comprise silicon oxide, silicon nitride, silicon oxynitride, low-k materials, or combinations thereof. In some embodiments, the conductive layer 430 may be formed of tungsten, or may be formed of other materials, such as copper. The conductive layer 430 may further comprise a barrier/adhesive layer 431 to prevent diffusion or provide a better adhesion between the conductive layer 430 and the insulating layer 424. The barrier layer 431 may comprise one or more layers formed of Ti, TiN, Ta, TaN, CoNi, NiSi, or other similar materials.

Figure 4D:
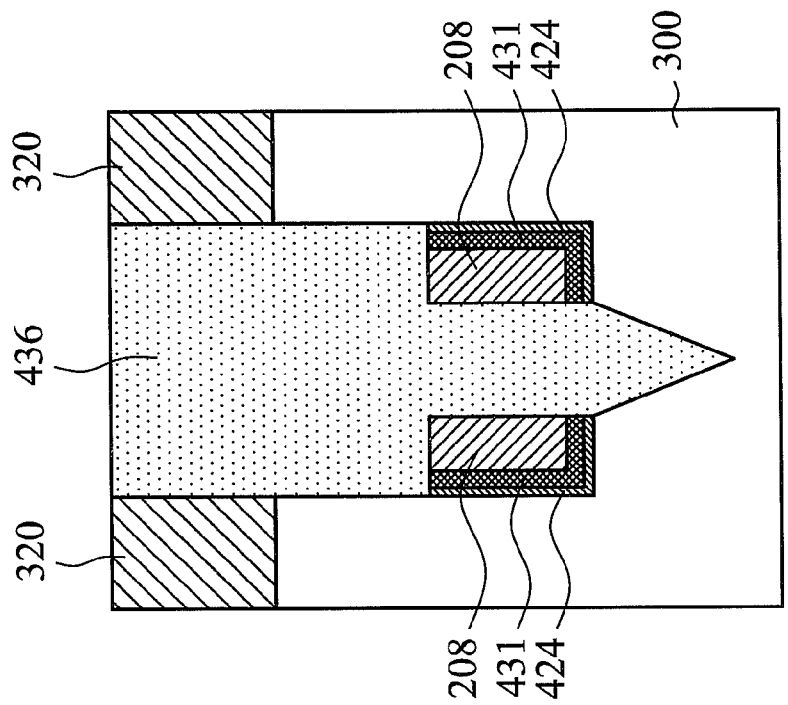
Figure 4C:
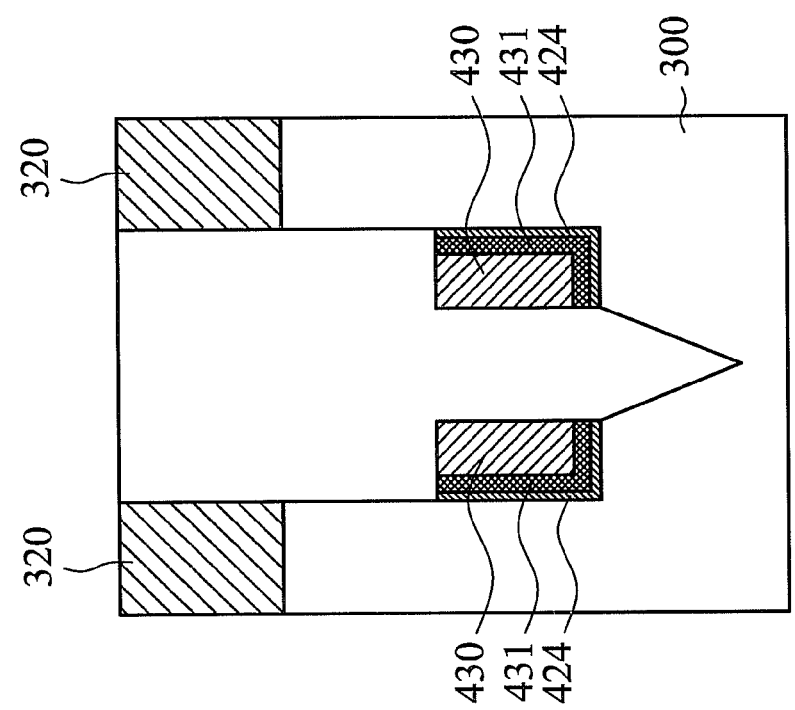

Then, referring to FIG. 4C, FIG. 4C illustrates etching of a center portion of the conductive layer 430 to divide the conductive layer 430 into two portions to form two word lines 208. In an embodiment, as shown in FIG. 4C, a portion of the insulating layer 424 may also be further etched. Each of the words lines 208 is electrically connected to an adjacent transistor (not shown).

Then, referring to the FIG. 4D, FIG. 4D illustrates forming of a capping oxide layer 436 in the word line trench 204 for protecting the word lines 204 and isolating the two word lines 204 to each other.

After the bit lines and the word lines are formed, storage capacitors may be formed over the transistors. Since the storage capacitors can be formed by known prior arts, the detailed fabrication techniques thereof will not be repeated here. In an embodiment, the storage capacitors may comprise a bottom electrode, a top electrode and a dielectric layer therebetween.

Furthermore, after the bit lines and the word lines are formed, two bit line plugs may be formed between any two adjacent bit line trenches 202, and two word line plugs may be formed between any two adjacent word line trenches 204. Thus, a bit line 206 in a bit line trench 202 would share two bit line plugs 212 with another adjacent the bit line 206 in another adjacent bit line trench 202 for providing their input/output signals. A word line 208 in a word line trench may share two word line plugs 214 with another adjacent word line 208 in another adjacent word line trench 204 for providing their input/output signals. Thus, each of the bit lines 206 may have two signal inputs/outputs, and each of the word lines 208 may have two signal inputs/outputs. When one of the two signal inputs/outputs cannot transmit signals to the storage capacitors. The signals of the bit line can be still transmitted to the storage capacitors by the other of the two signal inputs/outputs.

Figure 5:
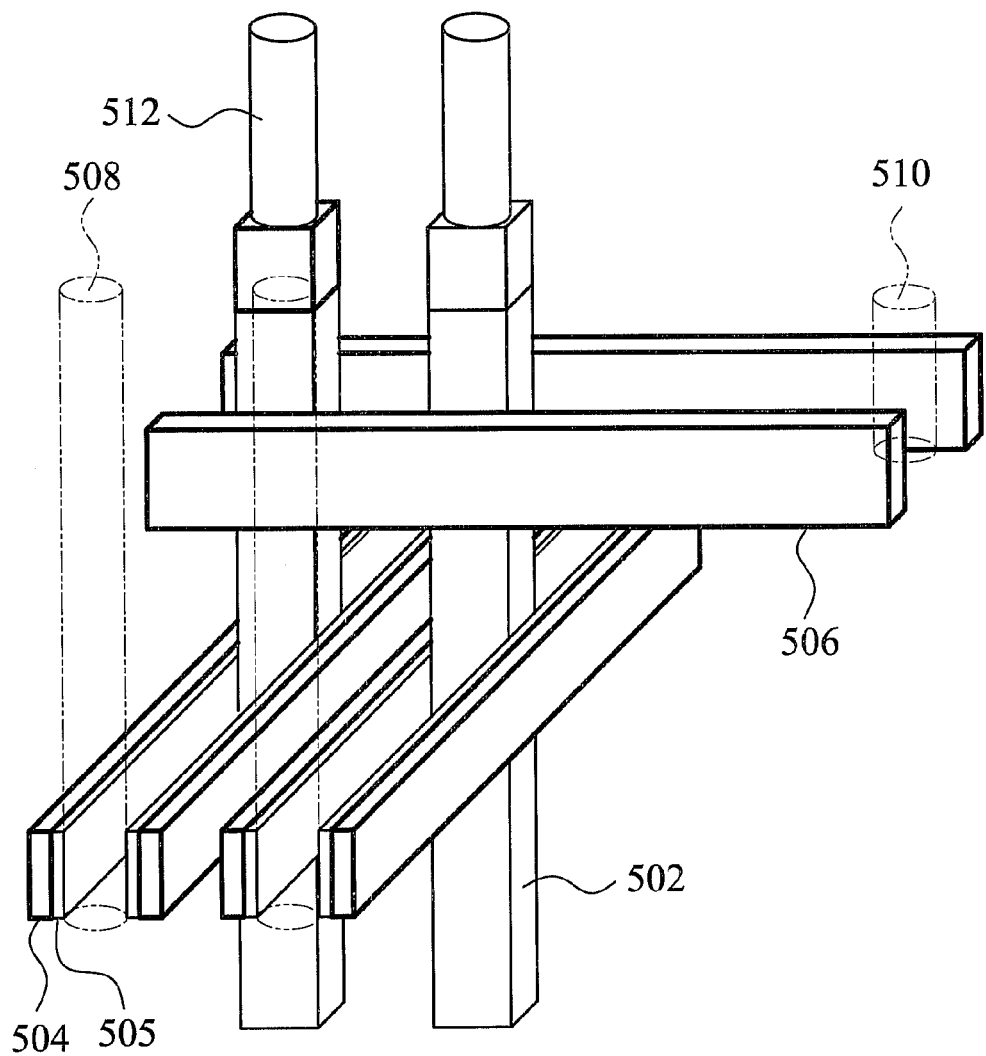
FIG. 5 illustrates a perspective scheme of a DRAM in accordance with one embodiment of the present invention.

Referring to FIG. 5, illustrated is a perspective scheme of a portion of the DRAM according to an embodiment of the present invention. Each of the semiconductor pillars 502 is surrounded by two bit lines 504 and two word lines 506. Each of the bit lines is electrically connected to the semiconductor pillar 502 via a contact 505. Word lines 506 are formed over the bit lines 504. Thus, the vertical channel regions of the semiconductor pillars 505 are define by the bit lines 504 and the word lines 506. The input/output signals of the bit lines 504 are transmitted by bit line plugs 508. The input/output signals of the word lines 506 are transmitted by word line plugs 510. The storage capacitors 512 are disposed over the top of the semiconductor pillars 502.

In the present invention, embodiments of a DRAM and a method for fabricating the same are provided. In some embodiments, two bit lines are formed in a bit line trench. Each of the two bit lines is electrically connected to its adjacent transistors via a contact, respectively. Thus, compared to the conventional process of fabricating the single sidewall contact in a bit line trench, many anisotropic etching processes can be reduced. In addition, the size and the location of the contacts are easy to control by using the method of fabricating the DRAM according to an embodiment of the present invention. Moreover, the process window is increased, but the cost is decreased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dynamic random access memory, comprising
a plurality of transistors formed in a semiconductor substrate, wherein each of the transistors comprises a vertical channel region;
a plurality of bit line contained trenches formed in the semiconductor substrate, wherein each of the bit line contained trenches comprises two bit lines, and a capping oxide layer sandwiched between the two bit lines to electrically isolate the two bit line from each other, and each of the bit lines is electrically connected to an adjacent transistor, and wherein each two sidewalls of each of the bit line contained trenches has a contact formed thereon, and wherein the capping oxide layer partially extends into an insulating layer under the bit lines; and
a plurality of word lines formed over the plurality of bit lines and electrically connecting to the plurality of transistors.

2. The dynamic random access memory as claimed in claim 1, wherein each of the bit lines is electrically connected to the adjacent transistor via one of the contacts.

3. The dynamic random access memory as claimed in claim 1, wherein the contacts have a height of between 20 and 500 nm.

4. The dynamic random access memory as claimed in claim 1, further comprising a plurality of storage capacitors on a top of the plurality of transistors.

5. The dynamic random access memory as claimed in claim 1, further comprising two bit line plugs disposed between any two adjacent bit line contained trenches.

6. The dynamic random access memory as claimed in claim 1, further comprising two word line plugs disposed between any two adjacent word lines.

7. The dynamic random access memory as claimed in claim 1, wherein the contacts comprise doped polysilicon.

8. The dynamic random access memory as claimed in claim 1, wherein the dynamic random access memory comprises $4F^2$ memory cells.

* * * * *